(12) United States Patent
Omoto

(10) Patent No.: US 7,154,787 B2
(45) Date of Patent: Dec. 26, 2006

(54) SEMICONDUCTOR MEMORY AND CONTROL METHOD THEREOF ALLOWING HIGH DEGREE OF ACCURACY IN VERIFY OPERATION

(75) Inventor: Kayoko Omoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/104,602

(22) Filed: Apr. 13, 2005

(65) Prior Publication Data

US 2005/0248985 A1    Nov. 10, 2005

(30) Foreign Application Priority Data

May 7, 2004    (JP)    ............................. 2004-138417

(51) Int. Cl.
*G11C 11/34*    (2006.01)
(52) U.S. Cl. .............................. 365/185.21; 365/185.22
(58) Field of Classification Search ........... 365/185.21, 365/185.22
See application file for complete search history.

(56) References Cited

U.S. PATENT DOCUMENTS

| | | | |
|---|---|---|---|
| 6,122,196 A | 9/2000 | Tanaka et al. | |
| 6,567,315 B1* | 5/2003 | Takase et al. | 365/185.28 |
| 6,801,458 B1* | 10/2004 | Sakui et al. | 365/185.24 |
| 6,930,924 B1* | 8/2005 | Takase et al. | 365/185.28 |
| 2005/0180212 A1* | 8/2005 | Kojima et al. | 365/185.11 |
| 2006/0049451 A1* | 3/2006 | Georgescu | 257/315 |

FOREIGN PATENT DOCUMENTS

| | | |
|---|---|---|
| JP | 4-159694 | 6/1992 |
| JP | 11-191298 | 7/1999 |

\* cited by examiner

*Primary Examiner*—M. Tran
(74) *Attorney, Agent, or Firm*—Buchanan Ingersoll & Rooney PC

(57) ABSTRACT

In write/erase verity operations of a memory transistor in a semiconductor memory, control of the semiconductor memory follows the following process. One main bit line is applied to be operative on the select side and another main bit line is applied to be operative on the reference side. On the select side, a sub bit line select transistor is turned on to select a sub bit line having connection to the memory transistor as a target for write/erase verify operations. The target memory transistor is turned on while the other memory transistors connected to the same sub bit line are turned off. On the reference side, a sub bit line select transistor is turned off to bring a sub bit line to a non-selected state.

17 Claims, 10 Drawing Sheets

F I G . 4
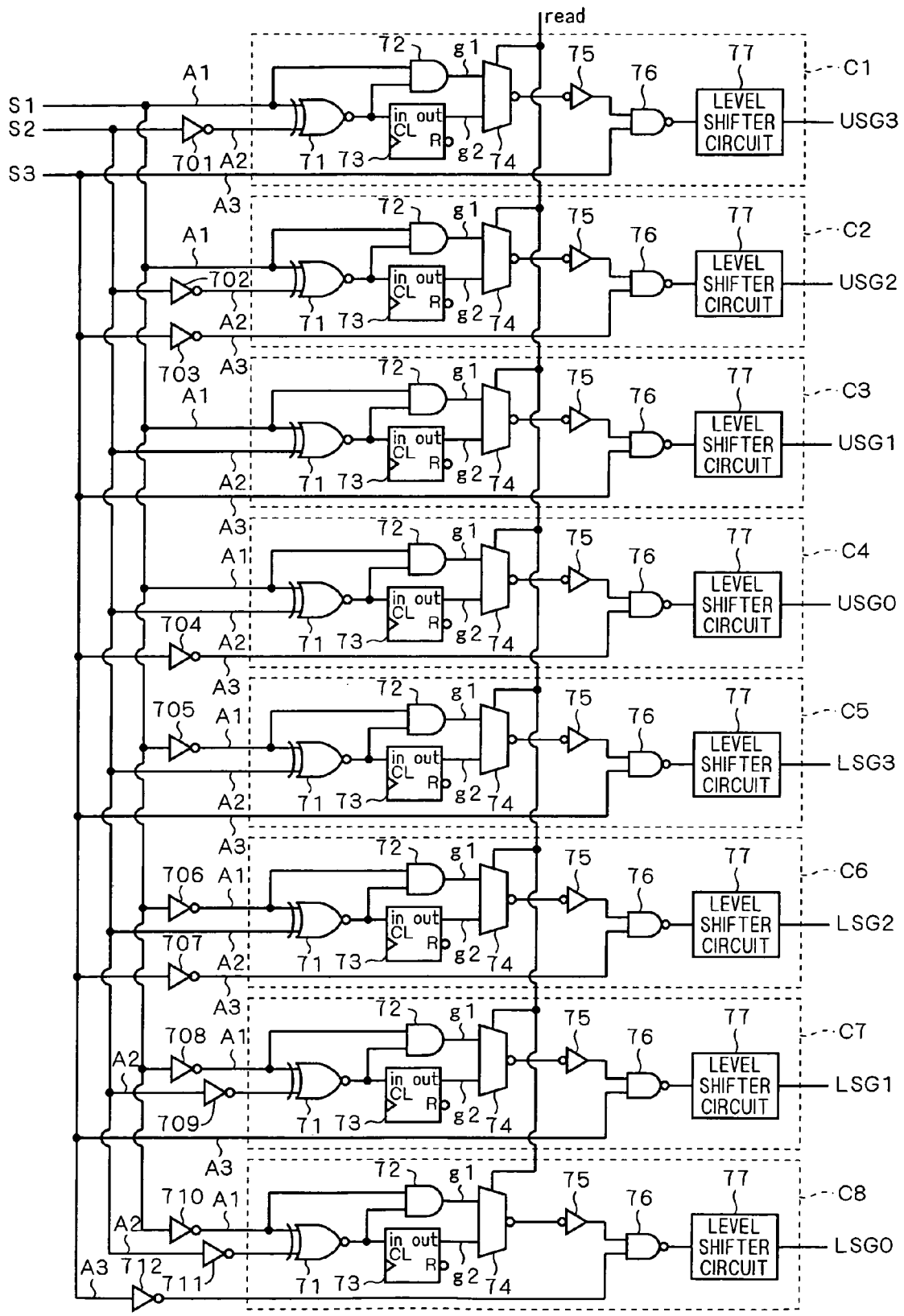

FIG. 5 read=0

| In | A1 | 0 | 1 | 0 | 0 | 1 | 0 | 1 | 1 |
|---|---|---|---|---|---|---|---|---|---|
|    | A2 | 0 | 0 | 1 | 0 | 1 | 1 | 0 | 1 |
|    | A3 | 0 | 0 | 0 | 1 | 0 | 1 | 1 | 1 |
| Out | | 1 | 1 | 1 | 1 | 1 | 1 | 1 | 0 |

FIG. 6 read=1

| In | A1 | 0 | 1 | 0 | 0 | 1 | 0 | 1 | 1 |
|---|---|---|---|---|---|---|---|---|---|
|    | A2 | 0 | 0 | 1 | 0 | 1 | 1 | 0 | 1 |
|    | A3 | 0 | 0 | 0 | 1 | 0 | 1 | 1 | 1 |
| Out | | 1 | 1 | 1 | 0 | 1 | 1 | 1 | 0 |

F I G. 7
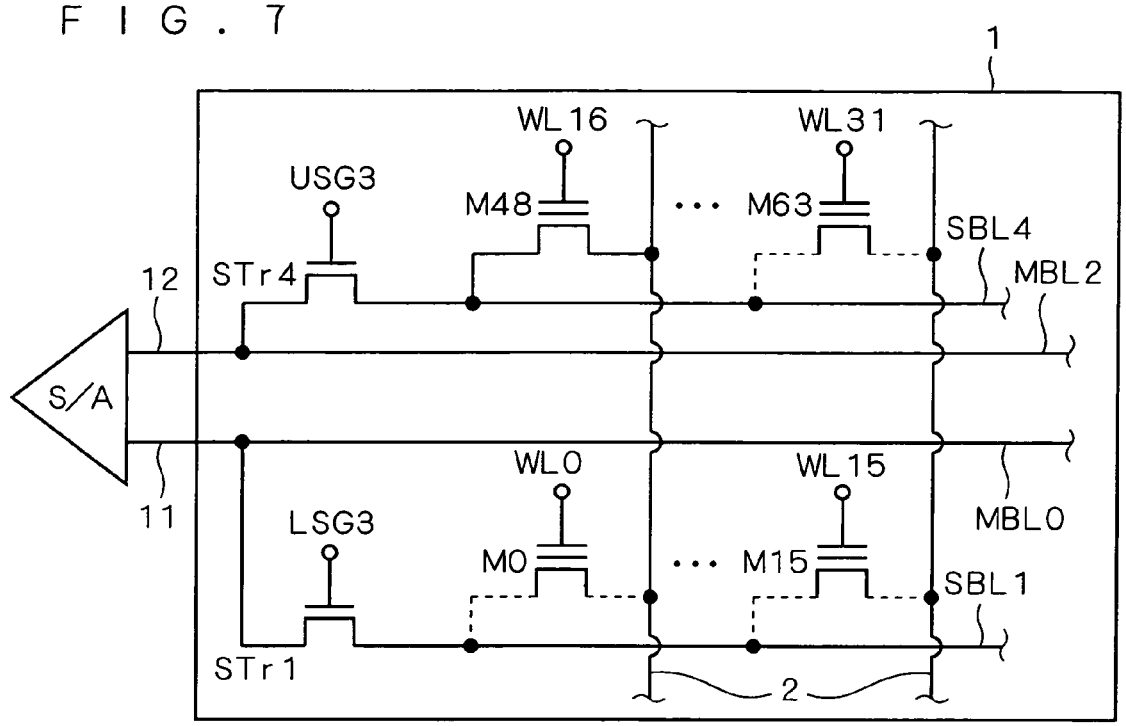

F I G . 1 2
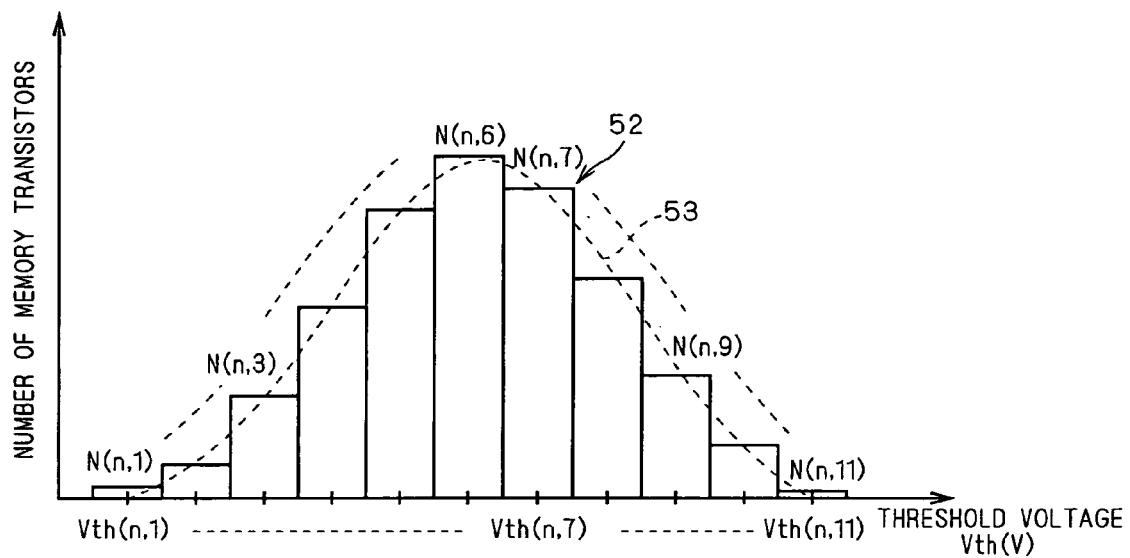
F I G . 1 3
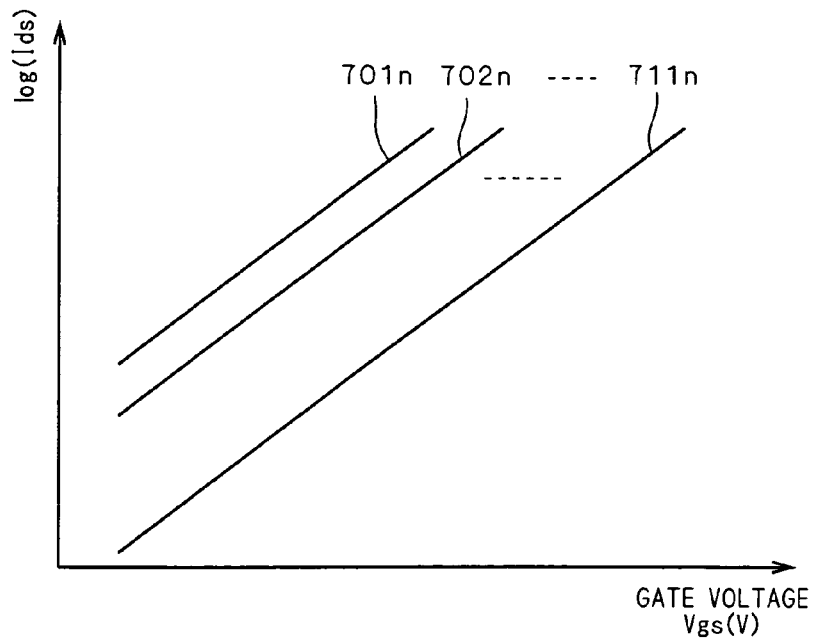

SEMICONDUCTOR MEMORY AND CONTROL METHOD THEREOF ALLOWING HIGH DEGREE OF ACCURACY IN VERIFY OPERATION

BACKGROUND OF THE INVENTION

1. Field of the Invention

The present invention relates to a semiconductor memory and a control method thereof, and is applicable for example to a flash memory.

2. Description of the Background Art

A semiconductor memory includes for example a main bit line, a sub bit line, memory cells and an amplifier for differential amplification. The sub bit line is connected in parallel to a plurality of memory cells. The sub bit line is connected for example through a transistor to the main bit line. The amplifier has two terminals each connected to the main bit line. One terminal is applicable to the reference side, and the other is applicable to the select side.

Techniques relevant to the present invention are introduced for example in Japanese Patent Application Laid-Open Nos. 4-159694 (1992) and 11-191298 (1999).

As an example, each memory cell may be an MOS transistor having a floating gate between a gate electrode and a gate insulating film. In this MOS transistor, data write and erase operations are realized respectively by injection and discharge of electrons or holes into and from the floating gate. Alternatively, the memory cell may be an MOS transistor in which data write operation is realized by trapping injected electrons or holes in an insulating film.

Like usual data read operation, checkup of write/erase operations, namely, write/erase verify operations follow the process given next. Here, it is assumed one of a plurality of memory cells connected through a sub bit line to a main bit line on the select side is a target for write/erase verify operations. First, this target memory cell is selected. Here, "selection" means, when memory cells are MOS transistors, this target memory cell is turned on while the other memory cells are turned off.

Next, a sub bit line connected to a main bit line on the reference side is selected in correspondence with the sub bit line having connection to the target memory cell. The selected sub bit line on the reference side is subjected to the flow of a comparison current, while all the memory cells connected thereto are turned off. The amplifier compares currents flowing through its terminals on the select side and reference side to thereby check up on write/erase operations.

More specifically, in erase verify operation, a prescribed voltage is applied to the gate electrode of a memory cell as a target for verify operation. If a current flowing through the terminal on the select side is larger than the comparison current, erase operation is verified.

In write verify operation, a prescribed voltage is applied to the gate electrode of a memory cell as a target for verify operation. If a current flowing through the terminal on the select side is smaller than the comparison current, write operation is verified.

When an over-erased memory cell is present for example on the reference side, a leakage current flows from this over-erased memory cell even when it is turned off. This is because, when a memory cell is an n-channel MOS transistor, for example, the threshold voltage thereof decreases as the degree of erasure of the memory cell increases. Then in the over-erased memory cell, the threshold voltage is made smaller than a prescribed value, whereby a current flowing through the terminal of the amplifier on the reference side is made larger than a certain current to flow therethrough.

Thus, in erase verify operation, erase operation of a target memory cell on the select side is not verified until the target memory cell is over-erased. In write verify operation, write operation of a target memory cell on the select side is verified even though write operation to the target memory cell has not reached a sufficient level.

When the over-erased memory cell on the reference side is thereafter subjected to write operation, a total current through the sub bit line on the reference is defined only by the comparison current. This reduces the difference in current between the select and reference sides, causing access delay.

If a memory cell to be subjected to read operation and an over-erased memory cell are connected to the same sub bit line, a leakage current flows from the over-erased memory cell in usual read operation of written data. This causes increase of a current flowing through the terminal of the amplifier on the select side by the leakage current to reduce the difference in current between the terminals on the select and reference sides, thus causing access delay.

If an over-erased memory cell is present on the select side, a leakage current flows from this memory cell in erase verify operation. Thus, erase operation of a memory cell as a target for erase verify operation is verified, even when a current flowing in the target memory cell is smaller than the comparison current by this leakage current, namely, even when erasure fails to reach a desired level. As a result, a memory cell having a threshold voltage larger than a voltage applied in erase verify operation (memory cell failing to reach a sufficient level of erasure) is generated.

When the over-erased memory cell on the select side is thereafter subjected to write operation, a total current through the sub bit line is reduced. When the memory cell failing to reach a sufficient level of erasure is selected in read operation of an erased memory cell, a total current flowing through the sub bit line by the application of a voltage in normal read operation is reduced accordingly, thereby causing access delay.

SUMMARY OF THE INVENTION

It is an object of the present invention to provide a high degree of accuracy in write/erase verify operations of a memory cell, so that access delay in usual read operation is prevented.

According to a first aspect of the present invention, a semiconductor memory includes a first main bit line, a first source line, a first transistor, a first sub bit line, a first memory transistor, a second main bit line, a second source line, a second transistor, a second sub bit line, a second memory transistor, and an amplifier. The first sub bit line is connected through the first transistor to the first main bit line. The first memory transistor has one end connected to the first sub bit line and another end connected to the first source line. The second sub bit line is connected through the second transistor to the second main bit line. The second memory transistor has one end connected to the second sub bit line and another end connected to the second source line. The amplifier is for differential amplification receiving respective currents flowing through the first and second main bit lines. The first transistor and the first memory transistor are turned on and no current flow is generated in the second memory transistor in verify operation of the first memory transistor.

Thus flow of a leakage current from the second memory transistor is prevented even when the second memory transistor is over-erased, whereby the threshold voltage of the first memory transistor is not overestimated in write/erase verify operations. As a result, a high degree of accuracy is provided in write/erase verify operations of the first memory transistor, so that access delay in usual read operation is prevented.

According to a second aspect of the present invention, the semiconductor memory includes a first main bit line, a first source line, a first transistor, a first sub bit line, a first memory transistor, a second memory transistor, a second main bit line, a second source line, a second transistor, a second sub bit line, a third memory transistor, and an amplifier. The first sub bit line is connected through the first transistor to the first main bit line. The first memory transistor has one end connected to the first sub bit line and another end connected to the first source line. The second memory transistor is connected in parallel to the first memory transistor, and has one end connected to the first sub bit line. The second sub bit line is connected through the second transistor to the second main bit line. The third memory transistor has one end connected to the second sub bit line and another end connected to the second source line. The amplifier is for differential amplification receiving respective currents flowing through the first and second main bit lines. The second and third memory transistors are formed in the same well. The first transistor and the first memory transistor are turned on and an off bias is applied to the well. The off bias is a back bias turning the second and third memory transistors off.

Thus flow of a leakage current from the second and third memory transistors is prevented even when the second and third memory transistors are over-erased, whereby the threshold voltage of the first memory transistor is not overestimated or underestimated in write/erase verify operations. As a result, a high degree of accuracy is provided in write/erase verify operations of the first memory transistor, so that access delay in usual read operation is prevented. Still advantageously, only the application of an optimized back bias to the well results in prevention of a leakage current, thereby leading to simplified control for verify operations.

According to a third aspect of the present invention, the semiconductor memory includes a first main bit line, a first source line, a first transistor, a first sub bit line, a first memory transistor, a second memory transistor, a second main bit line, and an amplifier. The first sub bit line is connected through the first transistor to the first main bit line. The first memory transistor has one end connected to the first sub bit line and another end connected to the first source line. The second memory transistor is connected in parallel to the first memory transistor, and has one end connected to the first sub bit line. The amplifier is for differential amplification receiving respective currents flowing through the first and second main bit lines. The first transistor and the first memory transistor are turned on and no current flow is generated in the second memory transistor in verify operation of the first memory transistor.

Thus a leakage current flowing from the second memory transistor is prevented even when the second memory transistor is over-erased, whereby the threshold voltage of the first memory transistor is not underestimated in write/erase verify operations. As a result, a high degree of accuracy is provided in write/erase verify operations of the first memory transistor, so that access delay in usual read operation is prevented.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 shows a circuit for switching sub bit lines between selected/non-selected states;

FIGS. 5 and 6 each show relationships between inputs and outputs;

FIG. 7 is a circuit diagram conceptually showing connections of a second preferred embodiment;

FIG. 12 shows distribution of the number of memory transistors with respect to threshold voltages;

FIG. 13 shows relationships between gate voltages and source-to-drain currents.

DESCRIPTION OF THE PREFERRED EMBODIMENTS

Figure 1:
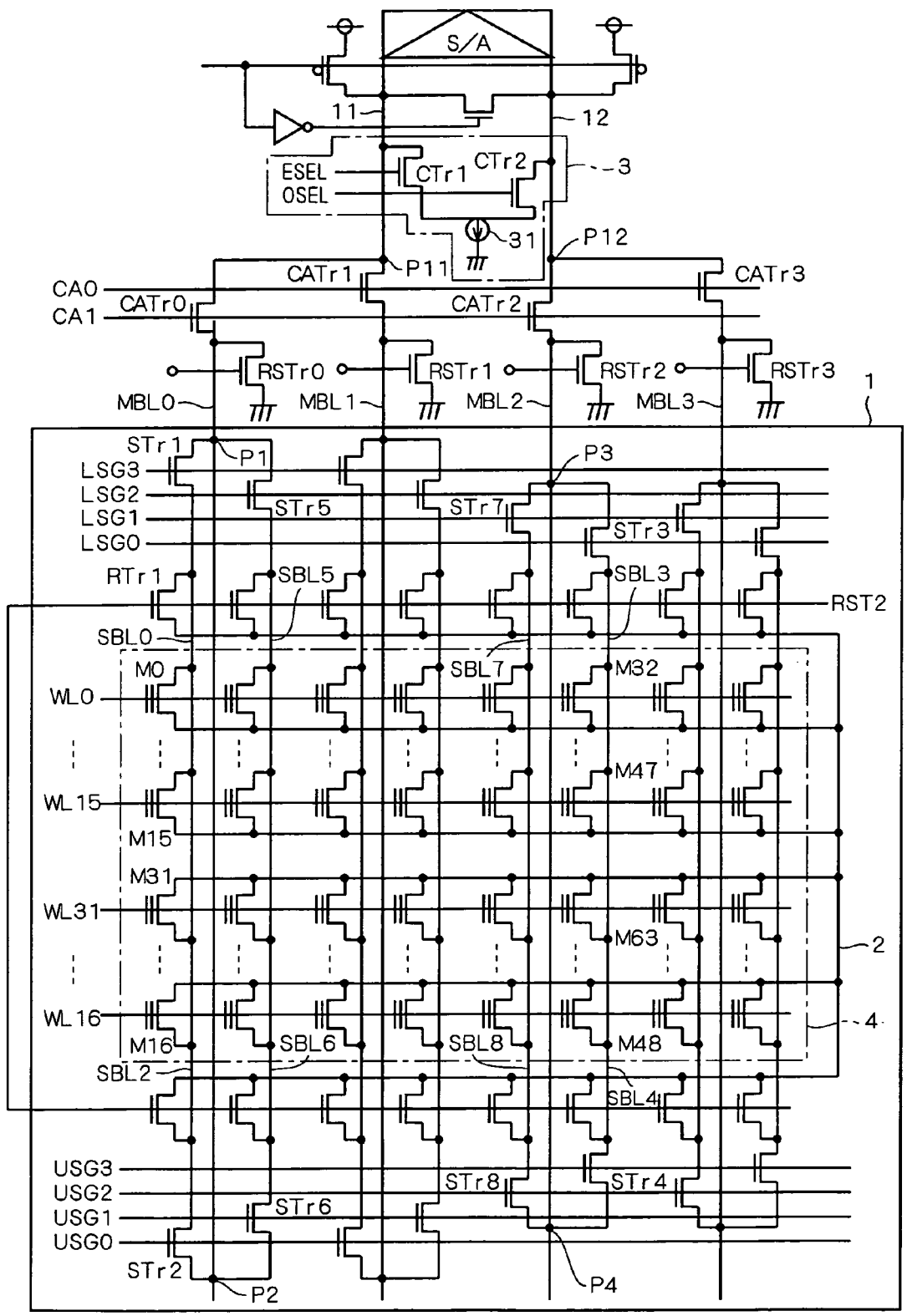
FIG. 1 is a circuit diagram conceptually showing a semiconductor memory of the present invention.

FIG. 1 is a circuit diagram conceptually showing a semiconductor memory of the present invention. The semiconductor memory includes a memory block 1, a sense amplifier S/A and a comparison current selector 3.

As an example, the sense amplifier S/A is a differential amplifier having terminals 11 and 12 as a pair. The terminal 11 is connected through a node P11 to main bit lines MBL0 and MBL1. The terminal 12 is connected through a node P12 to main bit lines MBL2 and MBL3.

The main bit lines MBL0 to MBL3 are connected respectively through main bit line select transistors CATr0 to CATr3 to the memory block 1. In FIG. 1, the main bit line select transistors CATr0 to CATr3 are shown as MOS transistors. The gate electrodes of the main bit line select transistors CATr0 and CATr2 are connected to a control line CA1. The gate electrodes of the main bit line select transistors CATr1 and CATr3 are connected to a control line CA0. Accordingly, the control line CA1 serves to concurrently turn the main bit line select transistors CATr0 and CATr2 on, thereby concurrently selecting the main bit lines MBL0 an MBL2. Likewise, the main bit lines MBL1 and MBL3 are concurrently selected.

The main bit lines MBL0 to MBL3 are respectively connected to main bit line reset transistors RSTr0 to RSTr3.

The comparison current selector 3 includes a comparison current generator 31, and comparison current select transistors CTr1 and CTr2. The comparison current selector 3 is connected between the terminals 11 and 12 of the sense amplifier S/A. In FIG. 1, the comparison current select transistors CTr1 and CTr2 are shown as MOS transistors. The comparison current generator 31 is connected through the comparison current select transistors CTr1 and CTr2 to the terminals 11 and 12, respectively. The gate electrodes of the comparison current select transistors CTr1 and CTr2 are respectively connected to control lines ESEL and OSEL.

A comparison current generated at the comparison current generator 31 flows either into the terminal 11 or 12 to be applied for example for reading data written into the memory block 1 or for write/erase verify operations. That is, one of the comparison current select transistors CTr1 and CTr2 is turned on whereas the other is turned off. By way of example, when a comparison current is to flow into the terminal 11, the comparison current select transistors CTr1 and CTr2 are turned on and off respectively by the action of the control lines ESEL and OSEL. The terminal subjected to the flow of a comparison current (terminal 11 in this example) is a terminal on the reference side, whereas the other terminal (terminal 12 in this example) is a terminal on the select side.

The memory block 1 has sub bit lines SBL1 to SBL8, sub bit line select transistors STr1 to STr8, a source line 2, and memory transistors M0 to M63. The main bit lines MBL0 to MBL3 extend into the memory block 1. In FIG. 1, the sub bit line select transistors STr1 to STr8 are shown as MOS transistors, and the memory transistors M0 to M63 are shown as floating gate MOS transistors. A group of memory transistors responsible for data write/erase operations is surrounded by dash-dot lines 4.

The sub bit line SBL1 is connected through the sub bit line select transistor STr1 to a node P1 in the main bit line MBL0. A control line LSG3 is connected to the gate electrode of the sub bit line select transistor STr1. The control line LSG3 serves to turn the sub bit line select transistor STr1 on and off, thereby switching the sub bit line SBL1 between selected/non-selected states.

The sub bit line SBL1 is connected to a sub bit line reset transistor RTr1 controlled by a control line RST2.

The memory transistors M0 to M15 each have one end connected to the sub bit line SBL1 and another end connected to the source line 2, and are placed from M0 to M15 in ascending numeric order when viewed from the node P1. The gate electrodes of the memory transistors M0 to M15 are respectively connected to word lines WL0 to WL15.

The sub bit line SBL5 is connected through the sub bit line select transistor STr5 to the node P1. The sub bit line SBL5 has the same configuration as that of the sub bit line SBL1. A control line LSG2 is connected to the gate electrode of the sub bit line select transistor STr5. The control line LSG2 serves to turn the sub bit line select transistor STr5 on and off, thereby switching the sub bit line SBL5 between selected/non-selected states.

The sub bit line SBL2 is connected through the sub bit line select transistor STr2 to the node P2 in the main bit line MBL0. A control line USG0 is connected to the gate electrode of the sub bit line select transistor STr2. The control line USG0 serves to turn the sub bit line select transistor STr2 on and off, thereby switching the sub bit line SBL2 between selected/non-selected states.

The sub bit line SBL2 is connected to a sub bit line reset transistor RTr2 controlled by the control line RST2.

The memory transistors M16 to M31 each have one end connected to the sub bit line SBL2 and another end connected to the source line 2, and are placed from M16 to M31 in ascending numeric order when viewed from a node P2. The gate electrodes of the memory transistors M16 to M31 are respectively connected to word lines WL16 to WL31.

The sub bit line SBL6 is connected through the sub bit line select transistor STr6 to the node P2. The sub bit line SBL6 has the same configuration as that of the sub bit line SBL2. A control line USG1 is connected to the gate electrode of the sub bit line select transistor STr6. The control line USG1 serves to turn the sub bit line select transistor STr6 on and off, thereby switching the sub bit line SBL6 between selected/non-selected states.

Likewise, the sub bit lines SBL3, SBL4, SBL7 and SBL8 are connected respectively through the sub bit line select transistors STr3, STr4, STr7 and STr8 to the main bit line MBL2 having connection to the terminal 12 of the sense amplifier S/A. Control lines LSG0, USG3, LSG1 and USG2 are respectively connected to the gate electrodes of the sub bit line select transistors STr3, STr4, STr7 and STr8. The control lines LSG0, USG3, LSG1 and USG2 serve to respectively turn the sub bit line select transistors STr3, STr4, STr7 and STr8 on and off, thereby respectively switching the sub bit lines SBL3, SBL4, SBL7 and SBL8 between selected/non-selected states. In FIG. 1, memory transistors having connections to the sub bit line SBL3 are identified by reference numerals M32 to M47 in ascending numeric order when viewed from a node P3. Memory transistors having connections to the sub bit line SBL4 are identified by reference numerals M48 to M63 in ascending numeric order when viewed from a node P4.

The main bit line MBL1 has the same configuration as that of the main bit line MBL0 discussed above. The main bit line MBL3 has the same configuration as that of the main bit line MBL2.

In the semiconductor memory described so far, the source line 2 is shared among memory transistors. Alternatively, memory transistors may have respective source lines.

In FIG. 1, the memory block 1 is shown to have a capacity of 256 bits. Alternatively, the memory block 1 may have a higher capacity such as 512 bits. As exemplary ways to increase capacity, the number of main bit lines or sub bit lines may be increased, or the number of memory transistors connected to one sub bit line may be increased.

In FIG. 1, one memory block 1 is connected to one sense amplifier S/A. Alternatively, more than one memory block 1 may be connected to one sense amplifier S/A. Still alternatively, several sense amplifies S/A may be provided.

In the semiconductor memory shown in FIG. 1, when one of memory transistors connected to the sub bit line SBL4 is a target for write/erase verify operations, a subject of comparison on the reference side with the sub bit line SBL4 may be the sub bit line SBL1, for example. In this case, the control lines LSG3 and USG3 serve to cooperatively control the sub bit line select transistors STr1 and STr4.

Turning to the other sub bit lines SBL2, SBL3 and SBL5 to SBL8, correspondences are established for example between the sub bit lines SBL5 and SBL8, between the sub bit lines SBL7 and SBL6, and between the sub bit lines SBL3 and SBL2. That is, linkages are formed between the control lines LSG2 and USG2, between the control lines LSG1 and USG1, and between the control lines LSG0 and USG0.

Preferred embodiments described below are directed to a method of controlling the foregoing semiconductor memory of the present invention when write/erase verify operations are performed therein. It is assumed that the memory transistors M0 to M63 are n-channel floating gate MOS transistors, the memory transistor M48 is a target for write/erase verify operations, and the sub bit line SBL1 is a subject of comparison on the reference side with the sub bit line SBL4 having connection to the memory transistor 48.

Figure 2:
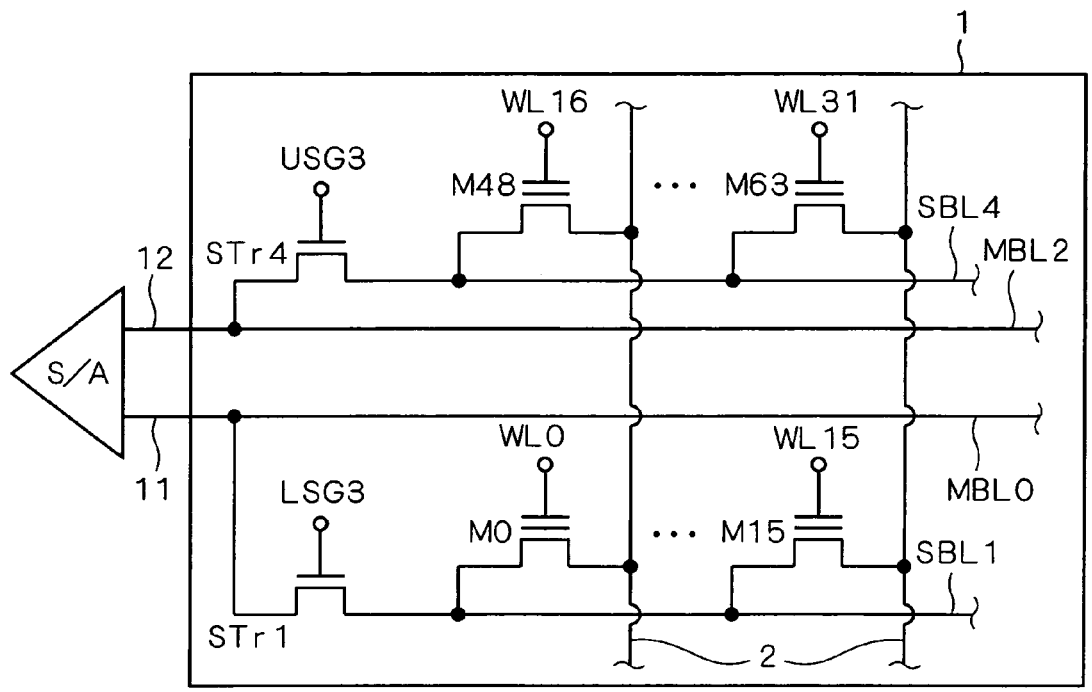
FIG. 2 shows an extracted part from the semiconductor memory of FIG. 1 concerned with verify operation of a memory transistor M48.

FIG. 2 shows an extracted part from the semiconductor memory of FIG. 1 concerned with write/erase verify operations of the memory transistor M48. The components corresponding to those of FIG. 1 are identified by the same reference numerals. The comparison current selector 3 is omitted from FIG. 2. The terminals 11 and 12 are defined to act on the reference and select sides, respectively. Although not shown, the main bit line select transistors CATr0 and CATr2 are turned on to respectively bring the main bit lines MBL0 and MBL2 to a selected state.

All the sub bit line select transistors except those controlled by the control lines USG3 and LSG3 are turned off by the action of the control lines USG0 to USG2 and LSG0 to LSG2. The main bit line select transistors CATr1 and CATr3 are turned off by the action of the control line CA0, thereby respectively bringing the main bit lines MBL1 and MBL3 to a non-selected state.

First Preferred Embodiment

In a first preferred embodiment of the present invention, it will be described how the semiconductor memory is controlled when the memory transistor M0 on the reference side is over-erased.

Figure 3:
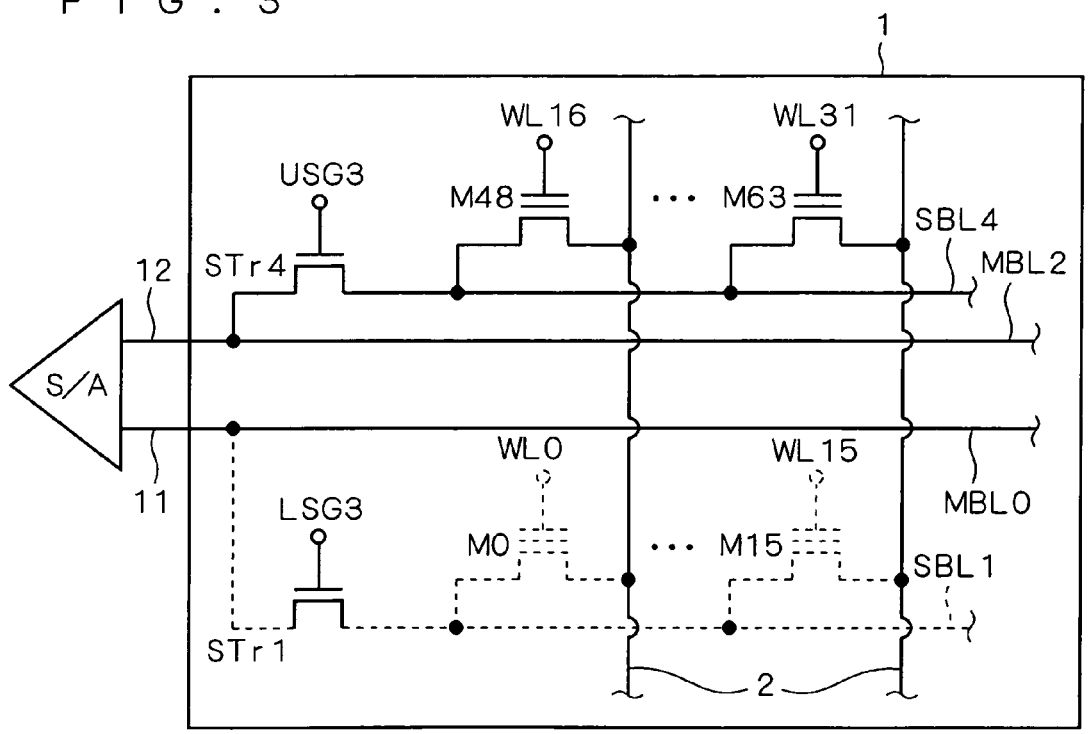
FIG. 3 is a circuit diagram conceptually showing connections of a first preferred embodiment.

FIG. 3 shows connections established by the control method of the first preferred embodiment. In FIG. 3, interconnect lines and elements subjected to no flow of current are indicated by dashed lines. For write/erase verify operations of the memory transistor M48, the sub bit line select transistor STr4 and the memory transistors M48 to M63 on the select side are controlled as follows. The sub bit line select transistor STr4 is turned on by the action of the control line USG3. The memory transistor M48 is turned on by the action of the word line WL16, whereas the memory transistors M49 to M63 also connected to the sub bit line SBL4 are turned off by the action of the word lines WL17 to WL31, respectively.

On the reference side, the sub bit line select transistor STr1 is turned off by the action of the control line LSG3 to bring the sub bit line SBL1 to a non-selected state. Then no current flow is generated in the memory transistor M0, thereby preventing the flow of a leakage current from the memory transistor M0.

Thus a leakage current to be generated in the over-erased memory transistor M0 is not added to a comparison current flowing through the main bit line MBL0 on the reference side, whereby the threshold voltage of the memory transistor M48 is not overestimated in write/erase verify operations. In other words, even when an over-erased memory transistor is one of the memory transistors M0 to M15 connected to the sub bit line SBL1 on the reference side, a high degree of accuracy is ensured in write/erase verify operations of the memory transistor M48 on the select side. As a result, access delay in usual read operation is prevented.

FIG. 4 shows a circuit for switching the sub bit lines SBL1 to SBL8 between selected/non-selected states. The circuit shown in FIG. 4 has circuits C1 to C8, input terminals S1 to S3 and read, NOT circuits 701 to 712, and the control lines USG0 to USG3 and LSG0 to LSG3.

The circuit C1 includes a coincidence circuit 71, an AND circuit 72, a latch circuit 73, a selector circuit 74, a NOT circuit 75, a NAND circuit 76, a level shifter circuit 77 and input terminals A1 to A3. The input terminals A1 and A2 are respectively connected to the input ends as a pair of the coincidence circuit 71. The latch circuit 73 has an input end in, an output end out, a clock terminal CL and a reset terminal R. The input end in of the latch circuit 73 is connected to the output end of the coincidence circuit 71. The input terminal A1 and the output end of the coincidence circuit 71 are respectively connected to the input ends as a pair of the AND circuit 72.

The selector circuit 74 has an input end g1 connected to the output end of the AND circuit 72, and an input end g2 connected to the output end out of the latch circuit 73. In response to a signal sent from the input terminal read, one of the input ends g1 and g2 is selected. That is, the input end g1 is selected when "0" is sent from the input terminal read. The input end g2 is selected when "1" is sent from the input terminal read. The input ends g1 and g2 invert received signals and output the results in the order selected. The output end of the selector circuit 74 is connected through the NOT circuit 75 to one input end of the NAND circuit 76.

The input terminal A3 is connected to the other input end of the NAND circuit 76. The output end of the NAND circuit 76 is connected through the level shifter circuit 77 to the control line USG3.

The circuits C2 to C8 each have a circuit configuration similar to that of the circuit C1. Besides, the output sides of the circuits C2 to C8 are respectively connected to the USG2 and USG1, and LSG3 to LSG0.

The input terminals S1 to S3 are each connected to the circuits C1 to C8 as follows. The input terminal S1 is directly connected to the respective input terminals A1 of the circuits C1 to C4, whereas it is connected through NOT circuits 705, 706, 708 and 710 to the respective input terminals A1 of the circuits C5 to C8.

The input terminal S2 is directly connected to the respective input terminals A2 of the circuits C3 to C6, whereas it is connected through NOT circuits 701, 702, 709 and 711 to the respective input terminals A2 of the circuits C1, C2, C7 and C8.

The input terminal S3 is directly connected to the respective input terminals A3 of the circuits C1, C3, C5 and C7, whereas it is connected through NOT circuits 703, 704, 707 and 712 to the respective input terminals A3 of the circuits C2, C4, C6 and C8.

The input terminals S1 to S3 each receive "0" or "1". That is, identifying signals received at the input terminals S1 to S3 by reference characters S1, S2 and S3, respectively, signals (S1, S2, S3) are any one of combinations (0, 0, 0), (1, 0, 0), (0, 1, 0), (0, 0, 1), (1, 1, 0), (0, 1, 1), (1, 0, 1) and (1, 1, 1).

When the signals (S1, S2, S3) selected from the foregoing combinations are given, signals (A1, A2, A3) sent to each one of the circuits C1 to C8 differ among the circuits C1 to C8. The signals (A1, A2, A3) are any one of combinations (0, 0, 0), (1, 0, 0), (0, 1, 0), (0, 0, 1), (1, 1, 0), (0, 1, 1), (1, 0, 1) and (1, 1, 1).

FIGS. 5 and 6 each show combinations of the signals (A1, A2, A3) received at the input terminals A1 to A3 (In), and their respective outputs (Out) in each one of the circuits C1 to C8. FIG. 5 shows a truth table when 0 is received at the input terminal read. FIG. 6 shows a truth table when 1 is received at the input terminal read.

As seen from the table shown in FIG. 5, when any one of the foregoing combinations is given as the signals (S1, S2, S3), "0" is provided to only one of the control lines USG3 to USG0 and LSG3 to LSG0 while the other control lines each receive "1". As an example, when (1, 0, 1) is applied as the signals (S1, S2, S3), only the control line USG3 in the circuit C1 receives "0" while the other control lines receive "1".

A control line provided with "0" turns on a sub bit line select transistor connected thereto. A control line provided with "1" turns off a sub bit line select transistor connected thereto. In this example, the control line USG3 receives "0", thereby turning the sub bit line select transistor STr4 on to select the sub bit line SBL4.

Accordingly, by giving "0" from the input terminal read and giving the signals (S1, S2, S3) in the circuit shown in FIG. 4, any one of the sub bit lines SBL1 to SBL8 is selected. Thus the circuit of FIG. 4 is applicable to the selection/non-selection of a sub bit line for write/erase verify operations of the first preferred embodiment.

As seen from the table shown in FIG. 6, when any one of the foregoing combinations is given as the signals (S1, S2, S3), "0" is provided to only two of the control lines USG3 to USG0 and LSG3 to LSG0 while the other control lines each receive "1". As an example, when (1, 0, 1) is applied as the signals (S1, S2, S3), only the control line USG3 in the circuit C1 and the control line LSG3 in the circuit C5 receive "0" while the other control lines receive "1".

A control line provided with "0" turns on a sub bit line select transistor connected thereto. A control line provided with "1" turns off a sub bit line select transistor connected thereto. In this example, the control lines USG3 and LSG3 each receive "0", thereby respectively turning the sub bit line select transistors STr4 and STr1 on to respectively select the sub bit lines SBL4 and SBL1.

Accordingly, by giving "1" from the input terminal read and giving the signals (S1, S2, S3) in the circuit shown in FIG. 4, 0s are given to any one of pairs of control lines including USG0 and LSG0, USG1 and LSG1, USG2 and LSG2, and USG3 and LSG3. Thus in the semiconductor memory shown in FIG. 1, linkages are formed between the control lines LSG3 and USG3, between the control lines LSG2 and USG2, between the control lines LSG1 and USG1, and between the control lines LSG0 and USG0.

The example in which "1" is given from the input terminal read is applicable to usual read operation, or to the control of a semiconductor memory in second and third preferred embodiments discussed later.

Second Preferred Embodiment

In a second preferred embodiment of the present invention, it will be described how the semiconductor memory is controlled when the memory transistor M0 on the reference side is over-erased using a method different from that in the first preferred embodiment.

FIG. 7 shows connections established by the control method of the second preferred embodiment. In FIG. 7, interconnect lines and elements subjected to no flow of current are indicated by dashed lines. Following the same process as in the first preferred embodiment, memory transistors on the select side are so controlled that only the memory transistor M48 is turned on.

On the reference side, the control line LSG3 turns the sub bit line select transistor STr1 on. The word line WL0 applies a gate voltage Vgs (0) causing no flow of a leakage current from the over-erased memory transistor M0 to the gate electrode of the memory transistor M0. The gate voltage Vgs (0) is determined relative to the voltage applied to the source, following the process of a fourth preferred embodiment described below.

It cannot be specified in actual use which of the memory transistors M0 to M15 has been over-erased. Thus like the memory transistor M0, the word lines WL1 to WL15 desirably apply the gate voltage Vgs (0) to the gate electrodes of the corresponding memory transistors M1 to M15.

The flow of a leakage current from the memory transistor M0 to the sub bit line SBL1 is prevented accordingly, thereby providing the same effect as obtained in the first preferred embodiment.

In the second preferred embodiment, the gate voltage Vgs (0) is applied to the gate electrode of the memory transistor M0 on the reference side. Alternatively, a back bias Vbs (0) causing no flow of a leakage current from the memory transistor M0 may be applied. The back bias Vbs (0) is determined relative to the voltage applied to the source, following the process of a fifth preferred embodiment described below.

Third Preferred Embodiment

In a third preferred embodiment of the present invention, it will be described how the semiconductor memory is controlled when the memory transistor M63 on the select side is over-erased. The connections established by the control method of the third preferred embodiment is shown for example in FIG. 7.

On the select side, the sub bit line select transistor STr4 is turned on by the action of the control line USG3, and the memory transistor M48 is turned on by the action of the word line WL16.

The word line WL31 applies the gate voltage Vgs (0) causing no flow of a leakage current from the over-erased memory transistor M63 to the gate electrode of the memory transistor M63. The gate voltage Vgs (0) is determined following the process of the fourth preferred embodiment described below.

Thus no current flow is generated in the memory transistor M63, thereby preventing the flow of a leakage current from the memory transistor M63.

It cannot be specified in actual use which of the memory transistors M49 to M63 has been over-erased. Thus like the memory transistor M63, the word lines WL17 to WL30 desirably apply the gate voltage Vgs (0) to the gate electrodes of the corresponding memory transistors M49 to M62.

On the reference side, the sub bit line select transistor STr1 is turned on by the action of the control line LSG3, and the word lines WL0 to WL15 respectively turn the memory transistors M0 to M15 off.

As discussed, there is no flow of a leakage current from the memory transistor M63. Thus a leakage current is not added to a current flowing through the sub bit line SBL4, whereby the threshold voltage of the memory transistor M48 is not underestimated in write/erase verify operations. In other words, even when an over-erased memory transistor is one of the memory transistors M49 to M63 connected to the sub bit line SBL4 on the select side, a high degree of accuracy is ensured in write/erase verify operations of the memory transistor M48 on the select side. As a result, access delay in usual read operation is prevented.

In the third preferred embodiment, the gate voltage Vgs (0) is applied to the gate electrode of the memory transistor M63. Alternatively, the back bias Vbs (0) causing no flow of a leakage current from the memory transistor M63 may be applied. The back bias Vbs (0) is determined following the process of the fifth preferred embodiment described below.

The third preferred embodiment may be combined with the foregoing first or second preferred embodiment, in which case the effects obtained both in the first or second preferred embodiment, and in the third preferred embodiment can be provided.

In the combined use of the second and third preferred embodiments, the memory transistors M0 to M15 on the reference side and the memory transistors M48 to M63 on the select side are desirably formed in the same well. This is because only the application of an optimized voltage to this well results in prevention of a leakage current, thereby leading to simplified control for verify operations.

Fourth Preferred Embodiment

In a fourth preferred embodiment of the present invention, it will be described how the gate voltage Vgs (0) causing no flow of a leakage current from an over-erased memory transistor is determined.

Figure 8:
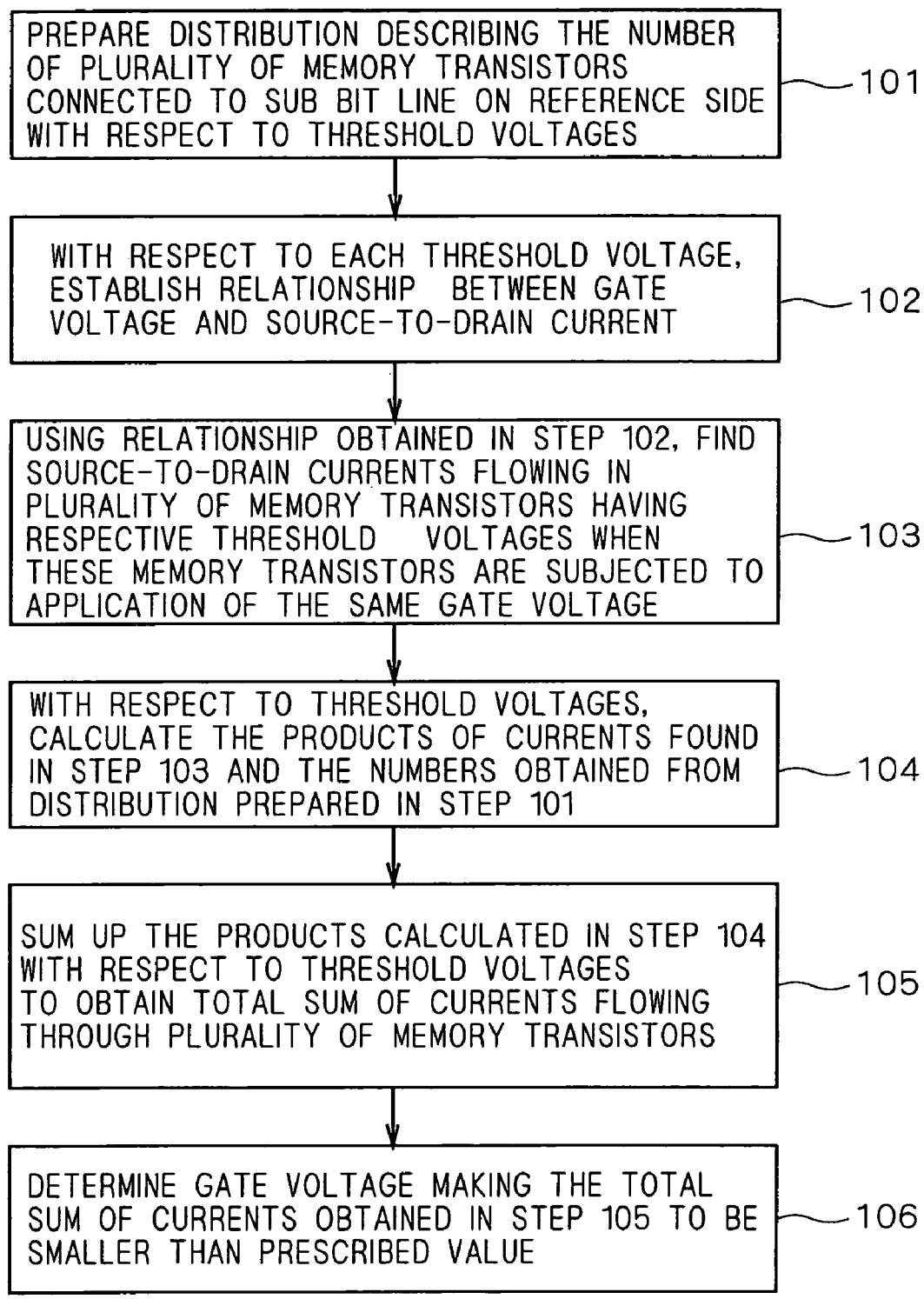
FIG. 8 is a flow chart showing a process flow for determining a gate voltage Vgs (0)
Figure 9:
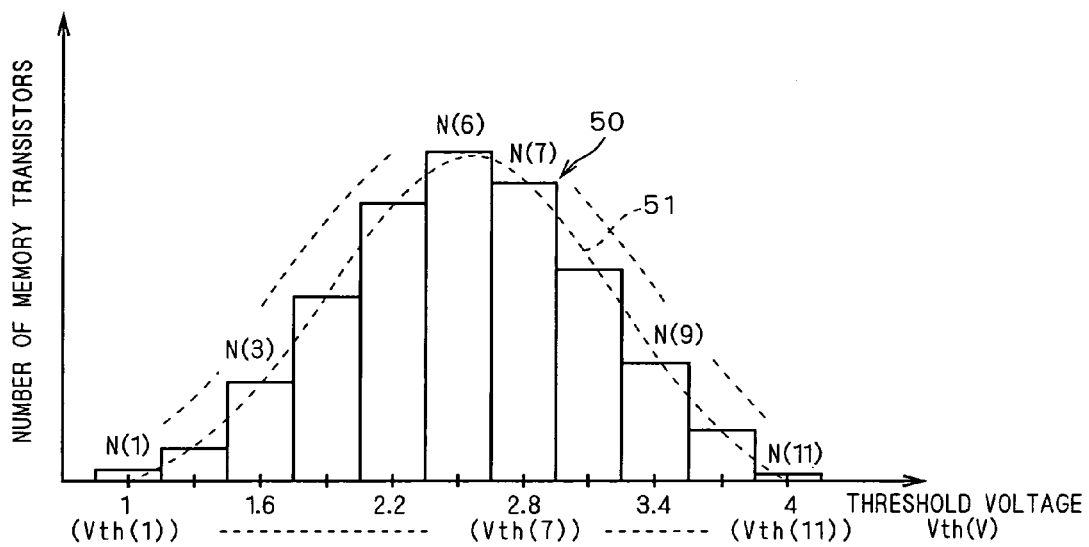
FIG. 9 shows distribution of the number of memory transistors with respect to threshold voltages.

FIG. 8 shows a process flow including steps 101 to 106 for determining the gate voltage Vgs (0). First, in step 101, distribution is prepared that describes the number of memory transistors including M0 to M15 connected to the sub bit line SBL1 on the reference side with respect to threshold voltages. Exemplary distribution of which is given as distribution 50 shown in FIG. 9. The distribution 50 is defined by the threshold voltage Vth having discrete values Vth (1) to Vth (11) that for example range from 1 V to 4 V in increments of 0.3 V, and corresponding numbers N (1) to N (11). The threshold voltage Vth may have more than 11 discrete values. A dashed line 51 is plotted by smoothly linking graph vertexes of the distribution 50, in the form of a substantially normal distribution curve, for example.

In step 102, with respect to each one of the threshold voltages Vth (1) to Vth (11), a relationship between the gate voltage Vgs and source-to-drain current Ids is established. The gate voltage Vgs is determined relative to the voltage applied to a source. Relationships thereby established between the gate voltages Vgs and the currents Ids with respect to the threshold voltages Vth (1) to Vth (11) are respectively given as graphs 601 to 611 shown in FIG. 10.

Figure 10:
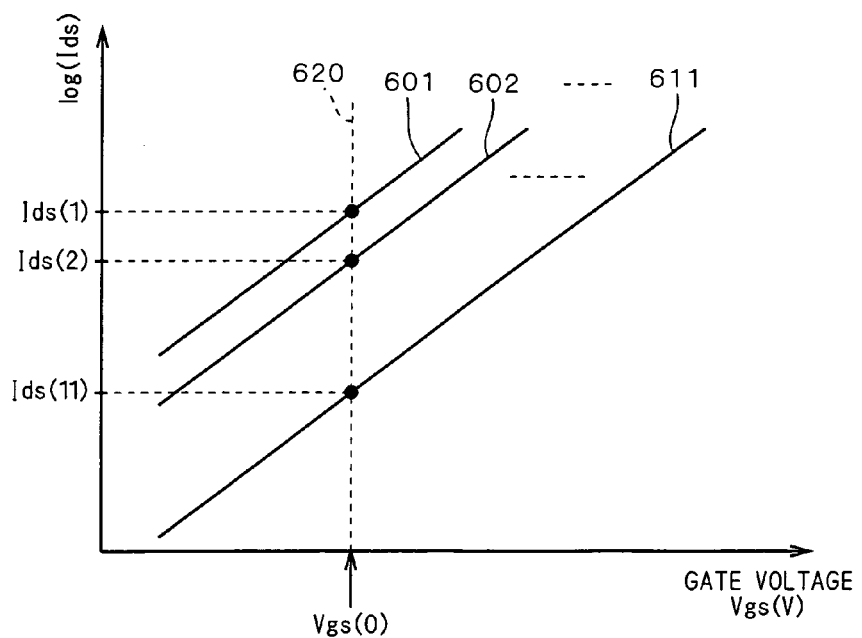
FIG. 10 shows relationships between gate voltages and source-to-drain currents.

In step 103, source-to-drain currents Ids (1) to Ids (11) flowing in the memory transistors having the threshold voltages from Vth (1) to Vth (11) are found when these memory transistors are subjected to application of the same gate voltage Vgs. More specifically, assuming that Vgs=Vgs (0), currents at the intersection points of a straight line 620 indicating Vgs=Vgs (0) and the graphs 601 to 611 are respectively identified as currents Ids (1) to Ids (11) as shown in FIG. 10.

In step 104, with respect to each one of the threshold voltages Vth (1) to Vth (11), the products Ids (1)·N (1) to Ids (11) ·N (11) of the currents Ids (1) to Ids (11) found in step 103 and the numbers N (1) to N (11) obtained from the distribution 50 prepared in step 101 are calculated.

In step 105, the products Ids (1)·N (1) to Ids (11)·N (11) calculated in step 104 are summed up as seen from the following expression (1). A current Itot (Vgs (0)) obtained therefrom is the total sum of currents flowing in the memory transistors M0 to M15, which is namely a leakage current.

$$Itot(Vgs(0)) = \sum_{i=1}^{11} Ids(i) \cdot N(i) \quad (1)$$

In step 106, the gate voltage Vgs (0) is so determined that the current Itot (Vgs (0)) is smaller than a prescribed value.

In terms of prevention of a leakage current during write/erase verify operations, such a prescribed value is desirably two orders of magnitude lower than that of a comparison current flowing through the reference side.

The gate voltage Vgs (0) thereby determined is applied to the gate electrode of an over-erased memory transistor, so that the flow of a leakage current from the over-erased memory transistor is prevented.

The fourth preferred embodiment may also be applied to the memory transistors M48 to M63 connected to the sub bit line SBL4 on the select side, in which case the same effect as above is provided.

Fifth Preferred Embodiment

In a fifth preferred embodiment of the present invention, it will be described how the back bias Vbs (0) causing no flow of a leakage current from an over-erased memory transistor is determined.

Figure 11:
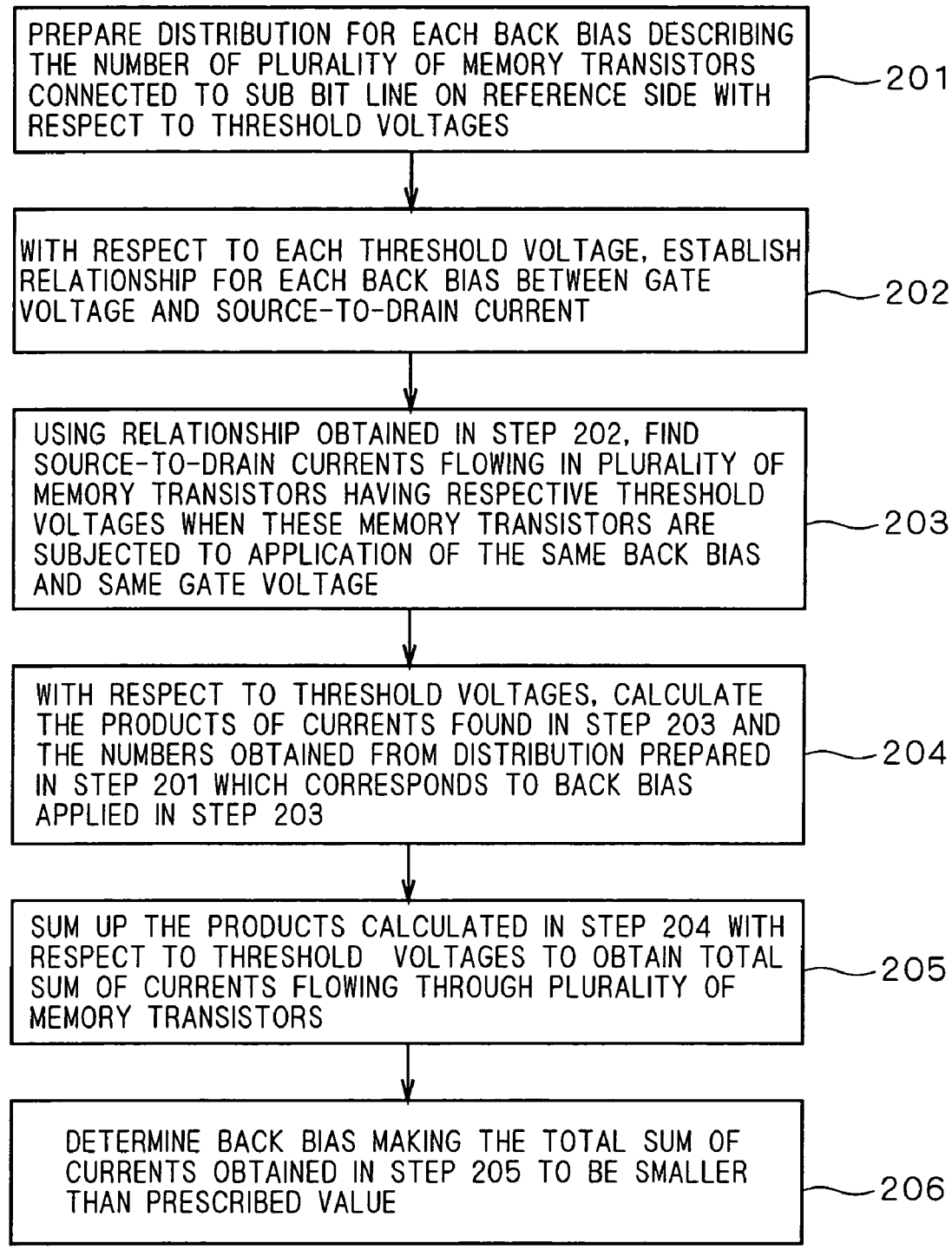
FIG. 11 is a flow chart showing a process flow for determining a back bias Vbs (0)

FIG. 11 shows a process flow including steps 201 to 206 for determining the back bias Vbs (0). First, in step 201, distribution is prepared for each back bias Vbs that describes the number of memory transistors including M0 to M15 connected to the sub bit line SBL1 on the reference side with respect to threshold voltages. The back bias Vbs is determined relative to the voltage applied to a source. Exemplary distribution of which is given as distribution 52 shown in FIG. 12 that is prepared for each back bias Vbs (n) (where n is a natural number). The distribution 52 is defined by the threshold voltage Vth having discrete values Vth (n, 1) to Vth (n, 11), and corresponding numbers N (n, 1) to N (n, 11). The threshold voltage Vth may have more than 11 discrete values. The threshold voltages Vth (n, 1) to Vth (n, 11) and the numbers N (n, 1) to N (n, 11) depend on the back bias Vbs (n). A dashed line 53 is plotted by smoothly linking graph vertexes of the distribution 52, in the form of a substantially normal distribution curve, for example.

In step 202, with respect to each one of the threshold voltages Vth (n, 1) to Vth (n, 11), a relationship between the gate voltage Vgs and source-to-drain current Ids is established for each back bias Vbs (n). Relationships thereby established between the gate voltages Vgs and the currents Ids with respect to the threshold voltages Vth (n, 1) to Vth (n, 11) are respectively given as graphs 701n to 711n shown in FIG. 13.

In step 203, source-to-drain currents Ids (m, 1) to Ids (m, 11) flowing in the memory transistors having the threshold voltages from Vth (n, 1) to Vth (n, 11) are found when these memory transistors are subjected to application of the same back bias Vbs (m) and the respective gate electrodes of the memory transistors are subjected to application of the same gate voltage Vgs (1). Here, m is any one of the natural numbers n.

Figure 14:
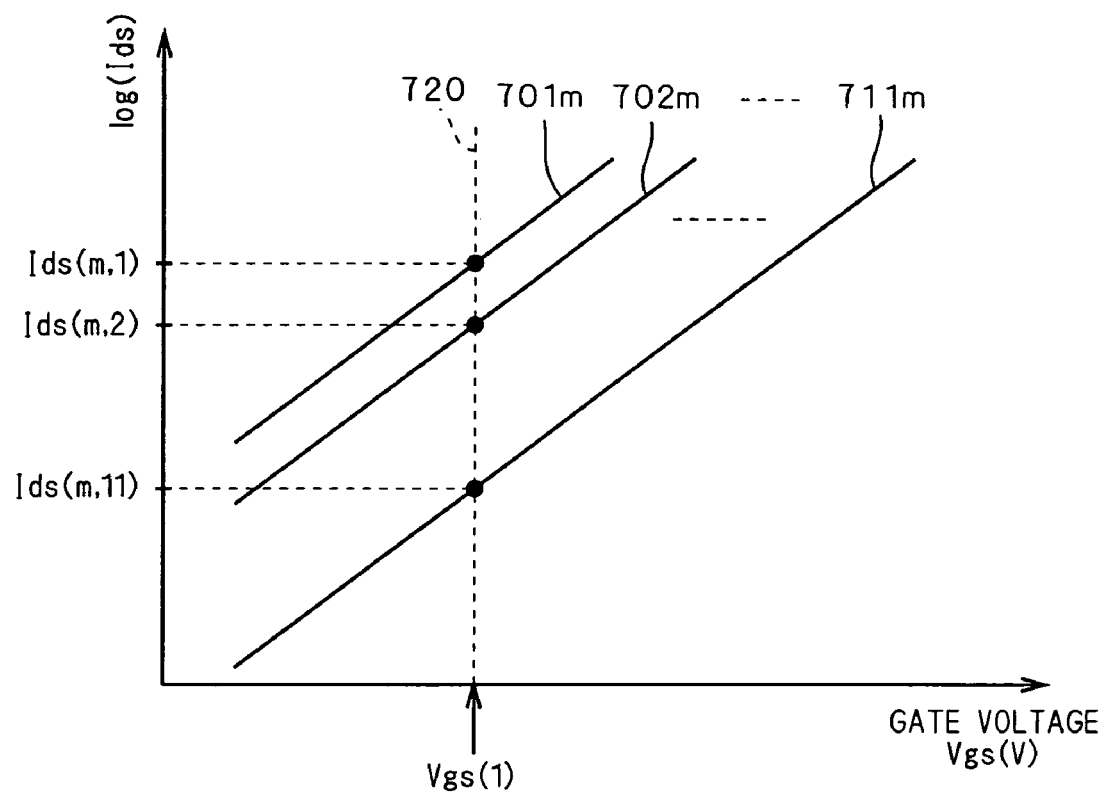
FIG. 14 shows source-to-drain currents flowing in memory transistors when a back bias Vbs (m) and a gate voltage Vgs (1) are applied.

Step 203 will be described in more detail with reference to FIG. 14. In FIG. 14, relationships between the gate voltages Vgs and currents Ids with respect to threshold voltages Vth (m, 1) to Vth (m, 11) are respectively given as graphs 701m and 711m when the back bias Vbs (m) is applied. Assuming that Vgs=Vgs (1), currents at intersection points of a straight line 720 indicating Vgs=Vgs (1) and the graphs 701m to 711m are respectively identified as currents Ids (m, 1) to Ids (m, 11).

In step 204, with respect to each one of the threshold voltages Vth (m, 1) to Vth (m, 11), the products Ids (m, 1) N (m, 1) to Ids (m, 11) N (m, 11) of the currents Ids (m, 1) to Ids (m, 11) found in step 203 and the numbers N (m, 1)

to N (m, 11) obtained from the distribution 52 prepared in step 201 by application of the back bias Vbs (m) are calculated.

In step 205, the products Ids (m, 1)·N (m, 1) to Ids (m, 11)·N (m, 11) calculated in step 204 are summed up as seen from the following expression (2). A current Itot (Vbs (m)) obtained therefrom is the total sum of currents flowing in the memory transistors M0 to M 15, which is namely a leakage current.

$$Itot(Vbs(m)) = \sum_{i=1}^{11} Ids(m, i) \cdot N(m, i) \qquad (2)$$

In step 206, the back bias Vbs (m) making the current Itot (Vbs (m)) to be smaller than a prescribed value is applied as the back bias Vbs (0) causing no flow of a leakage current from an over-erased memory transistor. In terms of prevention of a leakage current during write/erase verify operations, such a prescribed value is desirably two orders of magnitude lower than a comparison current flowing through the reference side.

Thus flow of a leakage current from an over-erased memory transistor is prevented.

The fifth preferred embodiment may also be applied to the memory transistors M48 to M63 connected to the sub bit line SBL4 on the select side, in which case the same effect as above is provided.

In the semiconductor memory in which the memory transistors M0 to M15 on the reference side and the memory transistors M48 to M63 on the select side are formed in the same well (as discussed in the third preferred embodiment), the process flow of the fifth preferred embodiment may be applied to both the memory transistors M0 to M15 and M48 to M63.

In this case, the back bias Vbs (0) determined therein is applied to this well, thereby preventing flow of a leakage current from an over-erased memory transistor.

In each one of the preferred embodiments described so far, it is assumed that memory transistors are n-channel floating gate MOS transistors, and that an memory transistor having a higher threshold voltage is subjected to write operation whereas a memory transistor having a lower threshold voltage is subjected to erase operation. When a memory transistor with a lower threshold voltage is to be subjected to write operation, targets for write and erase operations may be switched to thereby obtain the same effects. Still alternatively, memory transistors may be p-channel floating gate MOS transistors.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory comprising:
a first main bit line;
a first source line;
a first transistor;
a first sub bit line connected through said first transistor to said first main bit line;
a first memory transistor having one end connected to said first sub bit line and another end connected to said first source line;
a second main bit line;
a second source line;
a second transistor;
a second sub bit line connected through said second transistor to said second main bit line;
a second memory transistor having one end connected to said second sub bit line and another end connected to said second source line; and
an amplifier for differential amplification receiving respective currents flowing through said first and second main bit lines,
wherein said first transistor and said first memory transistor are turned on and no current flow is generated in said second memory transistor in verify operation of said first memory transistor,
wherein said second transistor is turned off in verify operation of said first memory transistor.

2. A semiconductor memory comprising:
a first main bit line;
a first source line;
a first transistor;
a first sub bit line connected through said first transistor to said first main bit line;
a first memory transistor having one end connected to said first sub bit line and another end connected to said first source line;
a second main bit line;
a second source line;
a second transistor;
a second sub bit line connected through said second transistor to said second main bit line;
a second memory transistor having one end connected to said second sub bit line and another end connected to said second source line; and
an amplifier for differential amplification receiving respective currents flowing through said first and second main bit lines,
wherein said first transistor and said first memory transistor are turned on and no current flow is generated in said second memory transistor in verify operation of said first memory transistor, and
wherein said second transistor is turned on and an off voltage is applied to a gate electrode of said second memory transistor, said off voltage being a voltage turning said second memory transistor off.

3. A method of controlling the semiconductor memory as defined in claim 2, said method determining said voltage turning said second memory transistor off,
wherein said second memory transistor includes a plurality of second memory transistors, and
wherein distribution is prepared that describes the number of said second memory transistors with respect to threshold voltages,
said method comprising the steps of:
finding source-to-drain currents flowing in said second memory transistors with respect to each one of said threshold voltages when respective gate electrodes of said second memory transistors are subjected to application of a gate voltage of the same value;
calculating the products of the numbers obtained from said distribution and said currents with respect to each one of said threshold voltages, and obtaining the total sum of said products with respect to said threshold voltages; and
determining said gate voltage making said total sum to be smaller than a prescribed value as said off voltage.

4. A semiconductor memory comprising:
a first main bit line;

a first source line;
a first transistor;
a first sub bit line connected through said first transistor to said first main bit line;
a first memory transistor having one end connected to said first sub bit line and another end connected to said first source line;
a second main bit line;
a second source line;
a second transistor;
a second sub bit line connected through said second transistor to said second main bit line;
a second memory transistor having one end connected to said second sub bit line and another end connected to said second source line; and
an amplifier for differential amplification receiving respective currents flowing through said first and second main bit lines,
wherein said first transistor and said first memory transistor are turned on and no current flow is generated in said second memory transistor in verify operation of said first memory transistor, and
wherein said second transistor is turned on and an off bias is applied to said second memory transistor, said off bias being a back bias turning said second memory transistor off.

5. A method of controlling the semiconductor memory as defined in claim 4, said method determining said back bias turning said second memory transistor off,
wherein said second memory transistor includes a plurality of second memory transistors, and
wherein distribution is prepared for each said back bias that describes the number of said second memory transistors with respect to threshold voltages,
said method comprising the steps of:
finding source-to-drain currents flowing in said second memory transistors with respect to each one of said threshold voltages when said second memory transistors are subjected to application of said back bias of the same value and respective gate electrodes of said second memory transistors are subjected to application of a gate voltage of the same value;
calculating the products of the numbers obtained from said distribution and said currents with respect to each one of said threshold voltages, and obtaining the total sum of said products with respect to said threshold voltages; and
determining said back bias making said total sum to be smaller than a prescribed value as said off bias.

6. A semiconductor memory, comprising:
a first main bit line;
a first source line;
a first transistor;
a first sub bit line connected through said first transistor to said first main bit line;
a first memory transistor having one end connected to said first sub bit line and another end connected to said first source line;
a second memory transistor connected in parallel to said first memory transistor, said second memory transistor having one end connected to said first sub bit line;
a second main bit line;
a second source line;
a second transistor;
a second sub bit line connected through said second transistor to said second main bit line;

a third memory transistor having one end connected to said second sub bit line and another end connected to said second source line; and
an amplifier for differential amplification receiving respective currents flowing through said first and second main bit lines,
wherein said second and third memory transistors are formed in the same well, and
wherein said first transistor and said first memory transistor are turned on and an off bias is applied to said well, said off bias being a back bias turning said second and third memory transistors off.

7. A method of controlling the semiconductor memory as defined in claim 6, said method determining said back bias turning said second and third memory transistors off,
wherein said second memory transistor includes a plurality of second memory transistors and said third memory transistor includes a plurality of third memory transistors, and
wherein distribution is prepared for each said back bias that describes the number of said second and third memory transistors with respect to threshold voltages,
said method comprising the steps of:
finding source-to-drain currents flowing in said second and third memory transistors with respect to each one of said threshold voltages when said well is subjected to application of said back bias and respective gate electrodes of said second and third memory transistors are subjected to application of a gate voltage of the same value;
calculating the products of the numbers obtained from said distribution and said currents with respect to each one of said threshold voltages, and obtaining the total sum of said products with respect to said threshold voltages; and
determining said back bias making said total sum to be smaller than a prescribed value as said off bias.

8. A semiconductor memory comprising:
a first main bit line;
a first source line;
a first transistor;
a first sub bit line connected through said first transistor to said first main bit line;
a first memory transistor having one end connected to said first sub bit line and another end connected to said first source line;
a second memory transistor connected in parallel to said first memory transistor, said second memory transistor having one end connected to said first sub bit line;
a second main bit line; and
an amplifier for differential amplification receiving respective currents flowing through said first and second main bit lines,
wherein said first transistor and said first memory transistor are turned on and no current flow is generated in said second memory transistor in verify operation of said first memory transistor,
wherein an off voltage is applied to a gate electrode of said second memory transistor, said off voltage being a voltage turning said second memory transistor off.

9. A method of controlling the semi conductor memory as defined in claim 8, said method determining said voltage turning said second memory transistor off,
wherein said second memory transistor includes a plurality of second memory transistors, and wherein distribution is prepared that describes the number of said second memory transistors with respect to threshold voltages, said method comprising the steps of:

finding source-to-drain currents flowing in said second memory transistors with respect to each one of said threshold voltages when respective gate electrodes of said second memory transistors are subjected to application of a gate voltage of the same value;

calculating the products of the numbers obtained from said distribution and said currents with respect to each one of said threshold voltages, and obtaining the total sum of said products with respect to said threshold voltages; and determining said gate voltage making said total sum to be smaller than a prescribed value as said off voltage.

10. A semiconductor memory comprising:

a first main bit line;

a first source line;

a first transistor;

a first sub bit line connected through said first transistor to said first main bit line;

a first memory transistor having one end connected to said first sub bit line and another end connected to said first source line;

a second memory transistor connected in parallel to said first memory transistor, said second memory transistor having one end connected to said first sub bit line;

a second main bit line; and an amplifier for differential amplification receiving respective currents flowing through said first and second main bit lines, wherein said first transistor and said first memory transistor are turned on and no current flow is generated in said second memory transistor in verify operation of said first memory transistor, and wherein an off bias is applied to said second memory transistor, said off bias being a back bias turning said second memory transistor off.

11. A method of controlling the semiconductor memory as defined in claim 10, said method determining said back bias turning said second memory transistor off, wherein said second memory transistor includes a plurality of second memory transistors, and wherein distribution is prepared for each said back bias that describes the number of said second memory transistors with respect to threshold voltages, said method comprising the steps of:

finding source-to-drain currents flowing in said second memory transistors with respect to each one of said threshold voltages when said second memory transistors are subjected to application of said back bias of the same value and respective gate electrodes of said second memory transistors are subjected to application of a gate voltage of the same value;

calculating the products of the numbers obtained from said distribution and said currents with respect to each one of said threshold voltages, and obtaining the total sum of said products with respect to said threshold voltages; and determining said back bias making said total sum to be smaller than a prescribed value as said off bias.

12. A semiconductor memory comprising:

a first main bit line;

a first source line;

a first transistor;

a first sub bit line connected through said first transistor to said first main bit line;

a first memory transistor having one end connected to said first sub bit line and another end connected to said first source line;

a second memory transistor connected in parallel to said first memory transistor, said second memory transistor having one end connected to said first sub bit line;

a second main bit line; and an amplifier for differential amplification receiving respective currents flowing through said first and second main bit lines, wherein said first transistor and said first memory transistor are turned on and no current flow is generated in said second memory transistor in verify operation of said first memory transistor;

a second source line;

a second transistor;

a second sub bit line connected through said second transistor to said second main bit line; and a third memory transistor having one end connected to said second sub bit line and another end connected to said second source line, wherein no current flow is generated in said third memory transistor in verify operation of said first memory transistor.

13. The semiconductor memory according to claim 12, wherein said second transistor is turned off in verify operation of said first memory transistor.

14. The semiconductor memory according to claim 12, wherein said second transistor is turned on and an off voltage is applied to a gate electrode of said third memory transistor, said off voltage being a voltage turning said third memory transistor off.

15. A method of controlling the semiconductor memory as defined in claim 14, said method determining said voltage turning said third memory transistor off, wherein said third memory transistor includes a plurality of third memory transistors, and wherein distribution is prepared that describes the number of said third memory transistors with respect to threshold voltages, said method comprising the steps of:

finding source-to-drain currents flowing in said third memory transistors with respect to each one of said threshold voltages when respective gate electrodes of said third memory transistors are subjected to application of a gate voltage of the same value;

calculating the products of the numbers obtained from said distribution and said currents with respect to each one of said threshold voltages, and obtaining the total sum of said products with respect to said threshold voltages; and determining said gate voltage making said total sum to be smaller than a prescribed value as said off voltage.

16. The semiconductor memory according to claim 12, wherein said second transistor is turned on and an off bias is applied to said third memory transistor, said off bias being a back bias turning said third memory transistor off.

17. A method of controlling the semiconductor memory as defined in claim 16, said method determining said back bias turning said third memory transistor off, wherein said third memory transistor includes a plurality of third memory transistors, and wherein distribution is prepared for each said back bias that describes the number of said third memory transistors with respect to threshold voltages, said method comprising the steps of:

finding source-to-drain currents flowing in said third memory transistors with respect to each one of said threshold voltages when said third memory transistors are subjected to application of said back bias of the same value and respective gate electrodes of said third memory transistors are subjected to application of a gate voltage of the same value;

calculating the products of the numbers obtained from said distribution and said currents with respect to each one of said threshold voltages, and obtaining the total sum of said products with respect to said threshold voltages; and determining said back bias making said total sum to be smaller than a prescribed value as said off bias.

* * * * *